(12) United States Patent
Park (10) Patent No.: US 9,287,482 B2
(45) Date of Patent: Mar. 15, 2016

(54) LIGHT EMITTING DIODE PACKAGE (71) Applicant: Seoul Semiconductor Co., Ltd., Ansan-si (KR)

(72) Inventor: Jae Hyun Park, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/375,384

(22) PCT Filed: Jan. 31, 2013

(86) PCT No.: PCT/KR2013/000787
§ 371 (c)(1),
(2) Date: Jul. 29, 2014

(87) PCT Pub. No.: WO2013/115578
PCT Pub. Date: Aug. 8, 2013

(65) Prior Publication Data
US 2015/0014717 A1 Jan. 15, 2015

(30) Foreign Application Priority Data

Jan. 31, 2012 (KR) ........................ 10-2012-0009899

(51) Int. Cl.
*H01L 33/64* (2010.01)
*H01L 33/48* (2010.01)
(Continued)

(52) U.S. Cl.
CPC .......... *H01L 33/644* (2013.01); *H01L 25/0753* (2013.01); *H01L 33/48* (2013.01); *H01L 33/56* (2013.01); *H01L 33/60* (2013.01); *H01L 33/62* (2013.01); *H01L 33/64* (2013.01); *H01L 33/641* (2013.01); *H01L 33/642* (2013.01); *H01L 2224/48091* (2013.01)

(58) Field of Classification Search
CPC ..... H01L 33/483; H01L 33/48; H01L 33/486; H01L 33/52; H01L 33/62
USPC ................................................. 257/88, 91, 99
See application file for complete search history.

(56) References Cited

U.S. PATENT DOCUMENTS 7,893,445 B2    2/2011  Van de Ven et al.
7,923,831 B2 *  4/2011  Ng ................................. 257/692
(Continued)

FOREIGN PATENT DOCUMENTS

JP    2010-212621    9/2010
JP    2011-192738    9/2011

OTHER PUBLICATIONS

International Search Report issued on May 31, 2013 in International Application No. PCT/KR2013/000787.
(Continued)

*Primary Examiner* — Eduardo A Rodela
(74) *Attorney, Agent, or Firm* — H.C. Park Associates, PLC (57) ABSTRACT

An embodiment of the invention provides a light emitting diode package. The light emitting diode package includes at least three light emitting diode chips; first leads comprising at least three chip mounting sections on which the at least three light emitting diode chips are mounted, respectively; second leads separated from the first leads and connected to the light emitting diode chips via wires, respectively; and a substrate having the first leads and the second leads formed thereon, wherein the at least three chip mounting sections are arranged around a center of the substrate through which an optical axis of the light emitting diode package passes.

20 Claims, 5 Drawing Sheets (51) Int. Cl.
*H01L 25/075* (2006.01)
*H01L 33/62* (2010.01)
*H01L 33/60* (2010.01)
*H01L 33/56* (2010.01)

(56) References Cited

U.S. PATENT DOCUMENTS

| | | | |
|---|---|---|---|
| 8,687,109 B2* | 4/2014 | Kametani et al. | 348/371 |
| 2004/0208210 A1* | 10/2004 | Inoguchi | 372/36 |
| 2007/0253209 A1* | 11/2007 | Loh et al. | 362/458 |
| 2008/0029780 A1* | 2/2008 | Ohtsuka et al. | 257/99 |
| 2008/0230790 A1* | 9/2008 | Seko et al. | 257/89 |
| 2009/0206758 A1 | 8/2009 | Kobilke | |
| 2010/0117099 A1 | 5/2010 | Leung | |
| 2010/0155748 A1* | 6/2010 | Chan et al. | 257/89 |
| 2011/0169037 A1* | 7/2011 | Hasegawa et al. | 257/98 |
| 2011/0186875 A1* | 8/2011 | Egoshi et al. | 257/89 |
| 2011/0241025 A1* | 10/2011 | Sakamoto et al. | 257/88 |
| 2011/0248289 A1* | 10/2011 | Hsieh et al. | 257/88 |
| 2012/0104426 A1* | 5/2012 | Chan et al. | 257/89 |
| 2012/0153299 A1* | 6/2012 | Yang | 257/77 |

OTHER PUBLICATIONS

Written Opinion issued on May 31, 2013 in International Application No. PCT/KR2013/000787.

* cited by examiner

LIGHT EMITTING DIODE PACKAGE

CROSS-REFERENCE TO RELATED APPLICATIONS

This application is the National Stage of International Application No. PCT/KR2013/000787, filed on Jan. 31, 2013, and claims priority from and the benefit of Korean Patent Application No. 10-2012-0009899, filed on Jan. 31, 2012, which are hereby incorporated by reference for all purposes as if fully set forth herein.

BACKGROUND

1. Field

The present invention relates to a light emitting diode package, and more particularly, to a multi-chip type light emitting diode package.

2. Discussion of the Background

Generally, a light emitting diode package includes a single light emitting diode chip therein. However, since it is difficult to obtain desired light output through a single light emitting diode chip, a plurality of light emitting diode packages is integrated into a single light emitting module.

Since the light emitting diode packages inside the light emitting module can be individually operated, each of the light emitting diode packages can act as an individual light source through individual operation and several light emitting diode packages can cooperate with one another to act as an integrated light source. However, since light emitting diode chips actually emitting light belong to different packages and thus are inevitably separated a long distance from each other in such a light emitting module, it is difficult for the light emitting diode packages to act as a single integrated light source. In addition, the use of a number of light emitting diode packages is disadvantageous in terms of economic feasibility.

Conventionally, it has been attempted to replace the plurality of light emitting diode package by a single light emitting diode package including a plurality of light emitting diode chips. Such an attempt has been restrictively made with regard to a lead frame type light emitting diode package. One approach is amplification of light output by mounting a plurality of light emitting diode chips having the same or similar wavelengths on a single terminal. However, this approach has a limit in that the light emitting diode chips cannot be individually operated.

As another approach, light emitting diode chips are respectively mounted on different terminals within single light emitting diode package. In this structure, the light emitting diode chips within the package can be individually operated. However, since this structure requires the light emitting diode chips to be sufficiently separated from each other within the package, there is a problem in that a process of mounting the light emitting diode package on a printed circuit board or a process of connecting the light emitting diode chips within the package can be complicated due to arrangement of the light emitting diode chips at too a long distance from the center, or due to complicated arrangement and pattern of the terminals. Moreover, there are many limits in use of three or more light emitting diode chips through individual operation.

SUMMARY

The present invention is aimed at providing a light emitting diode package, which is configured to allow at least three light emitting diode chips to be placed as close to each other as possible while allowing individual operation of these light emitting diode chips.

In accordance with one aspect of the invention, a light emitting diode package includes: at least three light emitting diode chips; first leads including at least three chip mounting sections on which the at least three light emitting diode chips are mounted, respectively; second leads separated from the first leads and connected to the light emitting diode chips via wires, respectively; and a substrate having the first leads and the second leads formed thereon, the at least three chip mounting sections being arranged around a center of the substrate through which an optical axis of the light emitting diode package passes.

According to one exemplary embodiment, the first leads may extend in a first direction to form at least three primary lower terminals at one side of the substrate, and the second leads may extend in a second direction opposite the first direction to form at least three secondary lower terminals at the other side of the substrate.

According to one exemplary embodiment, the at least three chip mounting sections may be arranged at constant angles around the center. For example, four chip mounting sections may be arranged at an angle interval of 90 degrees, and three chip mounting sections may be arranged at an angle interval of 120 degrees.

According to one exemplary embodiment, the first leads may include at least three primary upper terminals formed on an upper surface of the substrate to have the at least three chip mounting sections and at least three extensions extending from the at least three chip mounting sections in a first direction, respectively, and at least three first vias penetrating the substrate to connect the at least three extensions to at least three primary lower terminals formed on a lower surface of the substrate, respectively; and the second leads may include at least three secondary upper terminals located outside the at least three chip mounting sections and electrically connected to the at least three light emitting diode chips via bonding wires, respectively, and at least three second vias penetrating the substrate to connect the at least three secondary upper terminals to the at least three secondary lower terminals, respectively.

According to one exemplary embodiment, the substrate may be formed with a heat sink pad on a lower surface thereof and the heat sink pad may be located between the at least three primary lower terminals and the at least three secondary lower terminals. The heat sink pad may have a larger area than a total area of the at least three chip mounting sections.

According to one exemplary embodiment, the light emitting diode chips may be separated a constant distance from the center.

According to one exemplary embodiment, the light emitting diode package includes a cavity receiving the light emitting diode chips; a reflector disposed on the substrate; and a light transmitting encapsulation material formed by filling the cavity with a light transmitting resin. At this time, a reflective layer may be formed to a height corresponding to a middle height of the cavity, and the light transmitting encapsulation material may cover an upper end of the reflective layer. The reflector may include a first cavity plate stacked on an upper surface of the substrate and having a first cavity hole, and a second cavity plate stacked on the first cavity plate and having a second cavity hole having a larger diameter than the first cavity hole. Here, the reflective layer may be coated on an inclined inner peripheral surface of the first cavity hole and extend to a stepped face formed on the second cavity plate due to a difference in diameter between the first cavity hole and the second cavity hole. The reflector may further include a third cavity hole stacked on the second cavity plate and having a larger diameter than the second cavity hole, and the cavity may be formed at an upper portion thereof with a stepped face due to a difference in diameter between the second cavity hole and the third cavity hole.

According to one exemplary embodiment, the light emitting diode package may further include a heat sink disposed inside the substrate. Here, the substrate may include a first insulating plate (or first via plate) formed with a filling recess filled with the heat sink, and a second insulating plate (or second via plate) stacked on the first insulating plate to cover the filling recess.

According to one exemplary embodiment, the at least three light emitting diode chips may include at least three selected from among a white chip, a blue chip, a green chip and a red chip.

According to one exemplary embodiment, four chip mounting sections may be arranged around the center, and the light emitting diode chips may include a white chip, a blue chip, a green chip and a red chip mounted on the four chip mounting sections, respectively.

According to one exemplary embodiment, two of the at least three chip mounting sections may be placed adjacent to each other in a diagonal direction relative to the center, and a white chip and a blue chip may be respectively mounted on the two chip mounting sections to be adjacent to each other in the diagonal direction.

According to another exemplary embodiment, two of the at least three chip mounting sections may be placed adjacent to each other in a diagonal direction relative to the center, and a white chip and a green chip may be respectively mounted on the two chip mounting sections to be adjacent to each other in the diagonal direction.

According to a further exemplary embodiment, two of the at least three chip mounting sections may be placed adjacent to each other in a diagonal direction relative to the center, and a white chip and a red chip may be respectively mounted on the two chip mounting sections to be adjacent to each other in the diagonal direction.

According to one exemplary embodiment, the white chip may include a phosphor formed by conformal coating.

According to one exemplary embodiment, the first leads may have the same polarity, and the second leads may have a different polarity than the first leads.

In accordance with another aspect of the present invention, a light emitting diode package includes four light emitting diode chips comprising a white chip, a blue chip, a green chip, and a red chip; four first leads and four second leads configured to allow individual operation of the four light emitting diode chips; a substrate supporting the first leads and the second leads; and a light transmitting encapsulation part formed on the substrate and comprising a lens section covering the four light emitting diode chips, wherein one of the blue chip, the green chip, and the red chip is located near the white chip in a diagonal direction.

It is to be understood that both the foregoing general description and the following detailed description are exemplary and explanatory and are intended to provide further explanation of the invention as claimed.

According to the present invention, at least three emitting diode chips, for example, four light emitting diode chips, are disposed as close as possible to act as a single integrated light source while allowing individual operation of the light emitting diode chips, thereby realizing a light emitting diode package capable of emitting light having various colors (wavelength).

BRIEF DESCRIPTION OF THE DRAWINGS

The above and other aspects, features, and advantages of the present invention will become apparent from the detailed description of the following exemplary embodiments in conjunction with the accompanying drawings, in which.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

Figure 1:
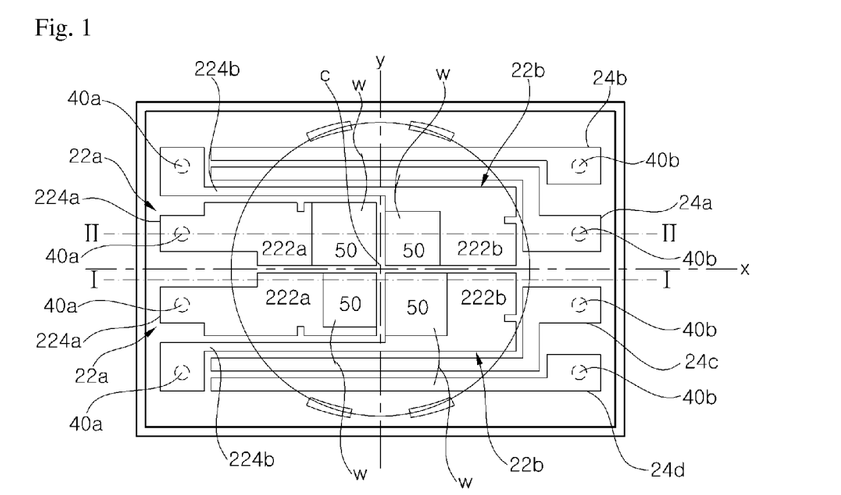
FIG. 1 is a plan view of a light emitting diode package according to one exemplary embodiment of the present invention.
Figure 2:
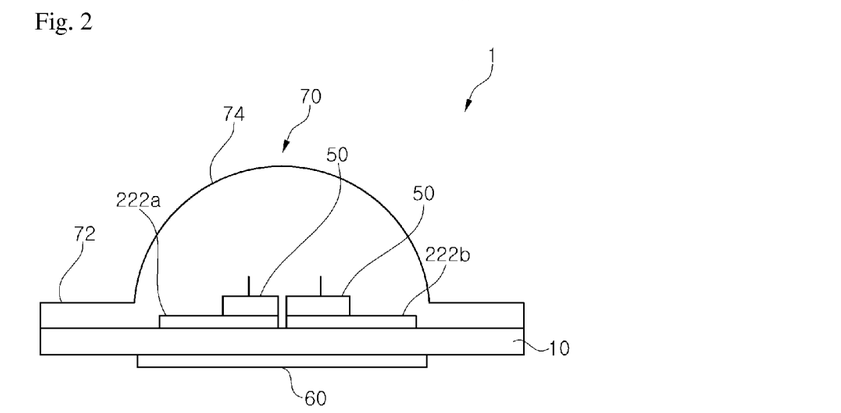
FIG. 2 is a cross-sectional view of the light emitting diode package taken along line I-I of FIG. 1.
Figure 3:
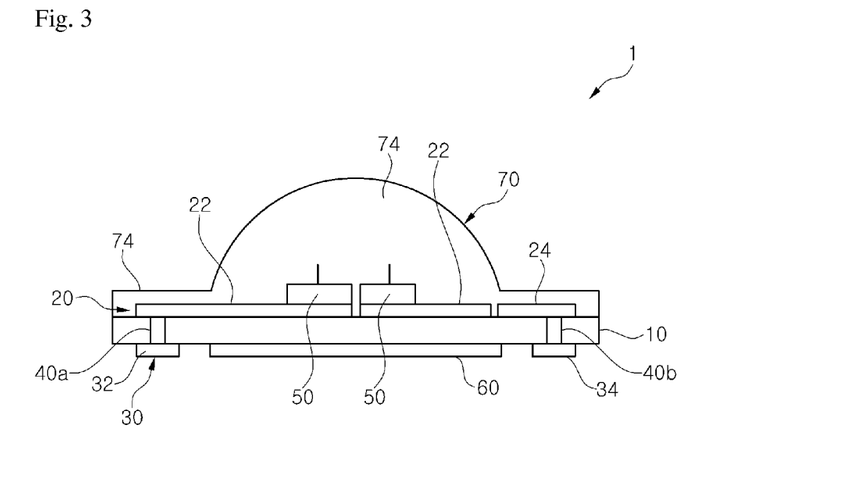
FIG. 3 is a cross-sectional view of the light emitting diode package taken along line II-II of FIG. 1.
Figure 4:
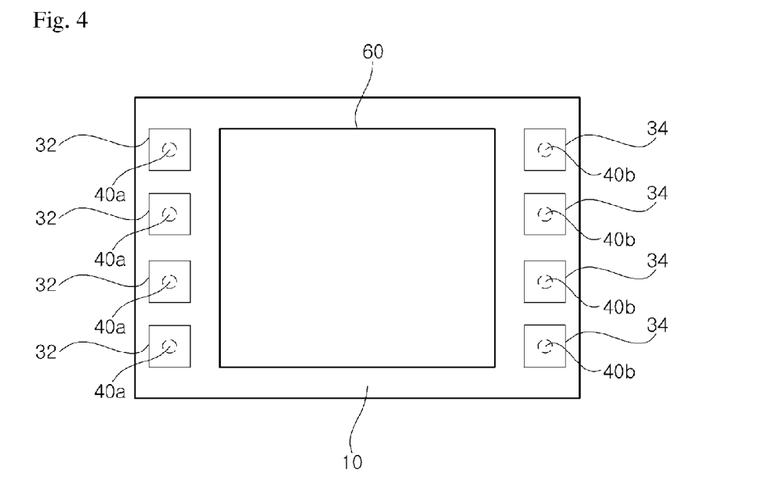
FIG. 4 is a bottom view of the light emitting diode package shown in FIG. 1 to FIG. 3.

FIG. 1 is a plan view of a light emitting diode package according to one exemplary embodiment of the present invention; FIG. 2 is a cross-sectional view of the light emitting diode package taken along line I-I of FIG. 1; FIG. 3 is a cross-sectional view of the light emitting diode package taken along line II-II of FIG. 1; and FIG. 4 is a bottom view of the light emitting diode package shown in FIG. 1 to FIG. 3.

First, referring to FIG. 3, a light emitting diode package 1 according to one exemplary embodiment includes a substrate 10, an upper terminal pattern 20 formed on an upper surface of the substrate 10, a lower terminal pattern 30 formed on a lower surface of the substrate 10, a plurality of vias 40a, 40b penetrating the substrate 40 to electrically connect the upper terminal pattern 20 and the lower terminal pattern 30 to each other, a plurality of light emitting diode chips 50 electrically connected to the upper terminal pattern 20 on the substrate 10, and a light transmitting encapsulation material 70 formed on the substrate 10 to cover the light emitting diode chips 50 and the upper terminal pattern 20.

The light transmitting encapsulation material 70 includes a semi-spherical lens section 74. The light transmitting encapsulation material 70 further includes a light transmitting flat base 72 formed at a lower portion of the lens section 74 and having a larger area than the lens section 74 to cover an overall upper surface of the substrate 10. In some embodiment, the light transmitting flat base 72 may be omitted from the light emitting diode package. The light transmitting encapsulation material 70 serves to ensure effective mixing of light having different wavelengths or colors emitted from the light emitting diode chips 50 while improving luminous efficacy. The light transmitting encapsulation material 70 may be formed of a light transmitting resin such as a silicone resin by, for example, transfer molding, compression molding, and the like.

The light emitting diode package 1 further includes a heat sink pad 60 formed on a lower surface of the substrate 10. The heat sink pad 60 is formed in a wide area at a central region on the lower surface of the substrate 10. The lower terminal pattern 30 is located around the heat sink pad 60 to be separated from the heat sink pad 60. The lower terminal pattern 30 and the heat sink pad 60 may be formed of the same material and have the same thickness.

Advantageously, the heat sink pad 60 has a thickness of about 60 μm or more to provide sufficient heat dissipation. In addition, the upper and lower terminal patterns 20, 30 advantageously have a thickness of about 60 μm or more. The heat sink pad 60 is advantageously formed together with the lower terminal pattern 30 by metal plating, or may include a separate heat dissipation slug.

The substrate 10 is an insulating substrate, particularly, a ceramic substrate. Further, the substrate 10 may be prepared using a single insulating plate, or may be prepared by stacking two or more insulating plates.

The upper terminal pattern 20 includes a plurality of primary upper terminals 22 on which the light emitting diode chips 50 are mounted, and a plurality of secondary upper terminals 24 on which the light emitting diode chip 50 are not mounted. In addition, the lower terminal pattern 30 includes primary lower terminals 32 connected to the primary upper terminals 22 by first vias 40a, and secondary lower terminals 34 connected to the secondary upper terminals 24 by second vias 40b. The heat sink pad 60 is formed so as not to connect with the vias 40a, 40b, and serves to dissipate heat from substrate 10 through rapid absorption of heat therefrom.

Each of the light emitting diode chips 50 may be a vertical type light emitting diode chip which is provided at upper and lower portions thereof with electrodes having different polarities, respectively. When the light emitting diode chips 50 are mounted on the corresponding primary upper terminals 22, the lower electrodes of the light emitting diode chips 50 are connected to the primary upper terminals 22, and the upper electrodes of the light emitting diode chips 50 are connected to the secondary upper terminals 24 via bonding wires. As described in detail below, the light emitting diode chips 50 emit light having different wavelengths or colors.

Referring to FIG. 1, the upper terminal pattern 20 includes four primary upper terminals 22a, 22a, 22b, 22b, and four secondary upper terminals 24a, 24b, 24c, 24d corresponding thereto. Each of the four primary upper terminals 22a, 22a, 22b, 22b includes a chip mounting section 222a or 222b, and an extension 224a or 224b extending from the chip mounting section 222a or 222b in a first direction and connected to an upper end of the first via 40a near one side of the substrate 10. Further, each of the four secondary upper terminals 24a, 24b, 24c, 24d has an elongated shape and is connected to an upper end of the second via 40b near the other side of the substrate 10 opposite the one side of the substrate. The four secondary upper terminals 24a, 24b, 24c, 24d are connected to the bonding wires (w) extending from the light emitting diode chips 50 instead of mounting the light emitting diode chips 50 thereon.

The four chip mounting sections 222a, 222a, 222b, 222b of the four primary upper terminals 22a, 22a, 22b, 22b are arranged around the center of the substrate 10. A point at which an imaginary horizontal line (x) intersects an imaginary vertical line (y) on the substrate 10 will be defined as the center (c). In addition, the substrate 10 is divided into four regions by the imaginary horizontal line (x) and the imaginary vertical line (y). Here, the four chip mounting sections 222a, 222a, 222b, 222b of the four primary upper terminals 22a, 22a, 22b, 22b are arranged around the center (c) while being located on the corresponding regions. At this time, it is desirable that an optical axis of the light emitting diode package, more specifically, a central axis of the lens section 74, pass through the center (c).

The four light emitting diode chips 50 are mounted on the four chip mounting sections 222a, 222a, 222b, 222b, respectively, and located near the center (c). The four light emitting diode chips 50 are different types of chips, which emit light having different wavelengths or colors, and may have different sizes, as described in more detail below. Regardless of the size difference, the light emitting diode chips 50 may be separated substantially the same distance from the center (c), whereby the four light emitting diode chips 50 are located at the same distance from the central axis of the lens section 74.

When the four light emitting diode chips 50 are simultaneously operated to emit light and thus act as a single integrated light source, the central axis or optical axis of the lens section 74 passes through the center of the integrated light source, whereby light finally emitted through the light transmitting encapsulation material 70 can be uniformly distributed.

Considering the lens section 74, the greatest interaction can be obtained between two light emitting diode chips 50, 50 disposed symmetrically relative to the center (c), through which the central axis of the lens section 74 passes, while facing each other in a diagonal direction. Thus, when two light emitting diode chips 50, 50 disposed symmetrically relative to the center (c) or facing each other in the diagonal direction have the same size, it is possible to improve color mixing properties between the light emitting diode chips 50, 50, which emit different colors. In addition, when two light emitting diode chips 50, 50 are frequently used, symmetrical arrangement of these light emitting diode chips 50, 50 relative to the center (c) may prevent mixed light of the two light emitting diode chips 50, 50 from being biased towards one side upon simultaneous operation of the two light emitting diode chips 50, 50.

The four extensions 224a, 224a, 224b, 224b of the primary upper terminals 22a, 22a, 22b, 22b extend from the four chip mounting sections 222a, 222a, 222b, 222b of the primary upper terminals 22a, 22a, 22b, 22b in the first direction and are connected to upper ends of four first vias 40a arranged in series near one side of the substrate 10, respectively.

For two first primary upper terminals 22a, 22a located at a left side nearer to one side of the substrate 10 relative to the vertical line (y) or the center (c), it is not necessary to take the width of the extensions 224a, 224a into account since there are no other terminals in the extending direction of the two extensions 224a, 224a.

However, for two second primary upper terminals 22b, 22b located at a right side farther from the one side of the substrate 10 relative to the vertical line (y) or the center (c), since the chip mounting sections 222a, 222a of the first primary upper terminals 22a, 22a are present in the first direction in which the two extensions 224b, 224b can extend, the chip mounting sections 222b, 222b of the second primary upper terminals 22b, 22b are formed to have a slightly greater width than the chip mounting sections 222a, 222a of the first primary upper terminals 22a, 22a, and the extensions 224b, 224b are formed to extend in the first direction and to have a width substantially corresponding to the increased width of the chip mounting sections 222b, 222b. With this structure, the width of the extensions 224a, 224b of the first primary upper terminals 22a, 22a may be greater than the width of the extensions 224a, 224b of the second primary upper terminals 22b, 22b.

Unlike the structure shown in the drawings, in at least one of the four primary upper terminals, the chip mounting section may have the same width as that of the extension. In this case, a portion of the at least one primary upper terminal, which has a greater width than the extension of the at least one primary upper terminal and corresponds to the length of the chip mounting sections of the other primary upper terminals, is defined as a chip mounting section, and the other portion of the at least one primary upper terminal is defined as an extension.

The four chip mounting sections 222a, 222a, 222b, 222b and the four light emitting diode chips 50, 50, 50, 50 mounted thereon are arranged at an angle interval of 90 degrees relative to the center (c). The two light emitting diode chips 50, 50 mounted on the chip mounting sections 222a, 222a of the first primary upper terminals 22a, 22a are adjacent to each other to face in a transverse direction, and the two light emitting diode chips 50, 50 mounted on the chip mounting sections 222b, 222b of the second primary upper terminals 22b, 22b are also adjacent to each other to face in the transverse direction. Further, one light emitting diode chip 50 on the chip mounting section 222a of the first primary upper terminal 22a is adjacent to one light emitting diode chip 50 on the chip mounting section 222b of the second primary upper terminal 22b in a longitudinal direction, and is also adjacent to another light emitting diode chip 50 on the chip mounting section 222b of the other second primary upper terminal 22b in a diagonal direction.

The four extensions 224a, 224a, 224b, 224b of the first and second primary upper terminals 22a, 22a; 22b, 22b extend from the four chip mounting sections 222a, 222a, 222b, 222b of the first and second primary upper terminals 22a, 22a, 22b, 22b in the first direction and are connected to the upper ends of the four first vias 40a arranged in series near the one side of the substrate 10.

Between the first and second secondary upper terminals 24a, 24b parallel to each other and the third and fourth secondary upper terminals 24c, 24d parallel to each other, the aforementioned four chip mounting sections 222a, 222a, 222b, 222b and the four light emitting diode chips 50, 50, 50, 50 mounted thereon are located. The first, second, third and fourth secondary upper terminals 24a, 24b, 24c, 24d are formed substantially in a linear shape and extend in a second direction opposite the first direction to be connected to upper ends of four second vias 40b arranged in series near the other side of the substrate 10, respectively. The second vias 40b are located to face the first vias 40a, respectively.

Since the four light emitting diode chips 50, 50, 50, 50 mounted on the chip mounting sections 222a, 222a, 222a, 222b, 222b of the primary upper terminals 22a, 22a, 22b, 22b separated from each other are individually electrically connected to the first, second, third and fourth secondary upper terminals 24a, 24b, 24c, 24d, which are separated from each other, via bonding wires (w), respectively, it is possible to achieve individual operation of the four light emitting diode chips 50, 50, 50, 50. Among the four bonding wires, two bonding wires (w, w) are bonded to the first and third secondary upper terminals 24a, 24c adjacent to edges of the chip mounting sections, respectively, and the other two bonding wires (w, w) extend beyond the first and third secondary upper terminals 24a, 24c and are connected to the second and fourth secondary upper terminals 24b, 24d, respectively.

Since two bonding wires (w, w) span between the primary upper terminals and the secondary upper terminals directly adjacent to each other, and the other bonding wires (w, w) extend over the thin linear secondary upper terminals and span between the primary upper terminals and the other secondary upper terminals, it is possible to achieve wire connection, which allows individual operation of all four light emitting diode chips 50, 50, 50, 50, through short bonding wires.

As described above, the primary upper terminals 22a, 22a, 22b, 22b are connected at distal ends thereof to the four first vias 40a near the one side of the substrate 10, and the secondary upper terminals 24a, 24b, 24c, and 24d are connected at distal ends thereof to the four second vias 40b near the other side of the substrate 10. Thus, it is advantageous to increase the areas of the distal ends of the upper terminals in order to improve connection reliability with the vias.

Referring to FIG. 1 to FIG. 4, particularly FIG. 4, the four first vias 40a perpendicularly penetrate the substrate 10 and are connected to the four primary lower terminals 32 formed on the lower surface of the substrate 10, and the four second vias 40b perpendicularly penetrate the substrate 10 and are connected to the four secondary lower terminals 34 formed on the lower surface of the substrate 10. The primary upper terminal 22a or 22b, first via 40a and primary lower terminal 32 successively connected to one another constitute a single first lead, which is directly connected to the light emitting diode chip 50, and the secondary upper terminal 24a, 24b, 24c or 24d, second via 40b and secondary lower terminal 34 successively connected to one another constitute a second lead, which is indirectly connected to the light emitting diode chip 50 via a bonding wire.

The four light emitting diode chips 50, 50, 50, 50 are directly mounted on four first leads and electrically connected to lower electrodes of the corresponding light emitting diode chips, and the four bonding wires extending from upper electrodes of the four light emitting diode chips 50, 50, 50, 50 are bonded to four second leads, respectively. Accordingly, when the light emitting diode package 1 is mounted on a printed circuit board (not shown), each of the four primary lower terminals 32 of the four first leads and each of the four secondary lower terminals 34 of the four second leads are individually connected to electrode pads on the printed circuit board, whereby the four light emitting diode chips 50, 50, 50, 50 of the light emitting diode package 1 can be individually operated.

The four first leads and the four primary lower terminals 32 thereof have the same electric polarity, and the four second leads and the four secondary lower terminals 34 thereof have the same electric polarity opposite to the polarity of the first leads. This structure reduces failure caused by connection between the leads of the light emitting diode package and the electrode pads of the printed circuit board having different polarities than those of the leads, and guarantees easy operation in mounting the light emitting diode package on the printed circuit board and compatibility of the light emitting diode package with the printed circuit board.

As clearly shown in FIGS. 2 and 4, the substrate 10 is formed on a lower surface thereof with a heat sink pad 60, which has substantially the same thickness as that of the lower terminals 32, 34 and is located at the center of the substrate between the four primary lower terminals 32 and the four secondary lower terminals 34. The heat sink pad 60 contacts the substrate 10 over a wide area in order to dissipate heat to the outside by absorbing heat from the substrate 10 through the contact area. The heat sink pad 60 may have a wider area than the total area of the light emitting diode chips 50 on the upper surface of the substrate 10. Furthermore, it is advantageous that the heat sink pad 60 cover the regions of the chip mounting sections 222a, 222b while having a larger area than the total area of the chip mounting sections 222a, 222b on the upper surface of the substrate 10. Further, the heat sink pad 60 has a larger area than the total area of the primary lower terminals 32 and the secondary lower terminals 34 on the lower surface of the substrate 10.

Figure 5:
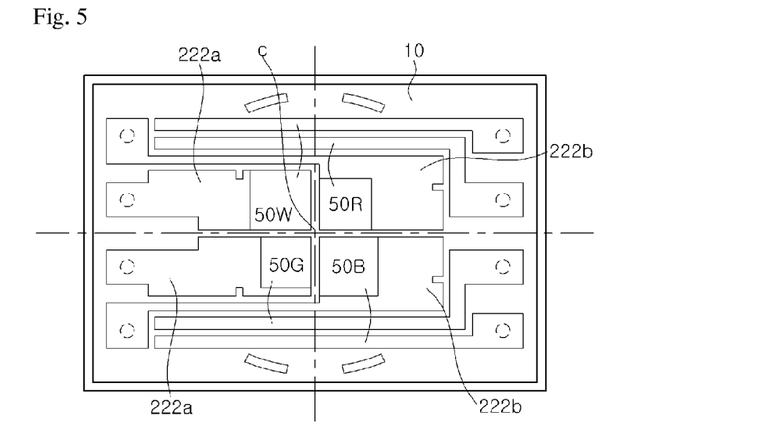
FIG. 5 to FIG. 7 are plan views of various embodiments of light emitting diode chips applicable to the light emitting diode package shown in FIG. 1 to FIG. 4.
Figure 6:
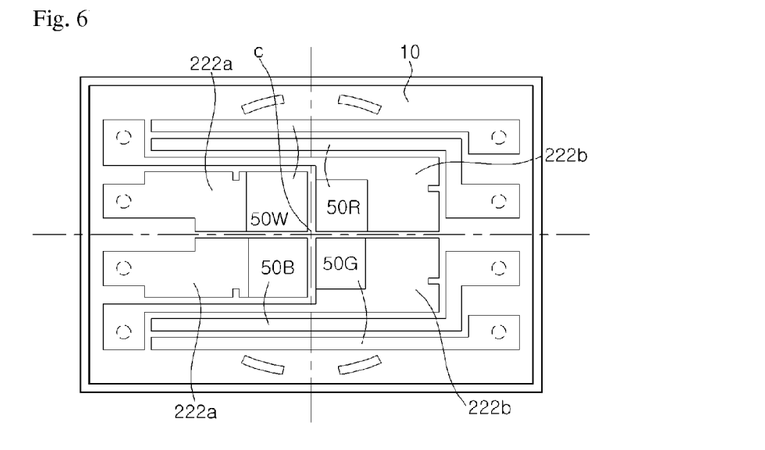
Figure 7:
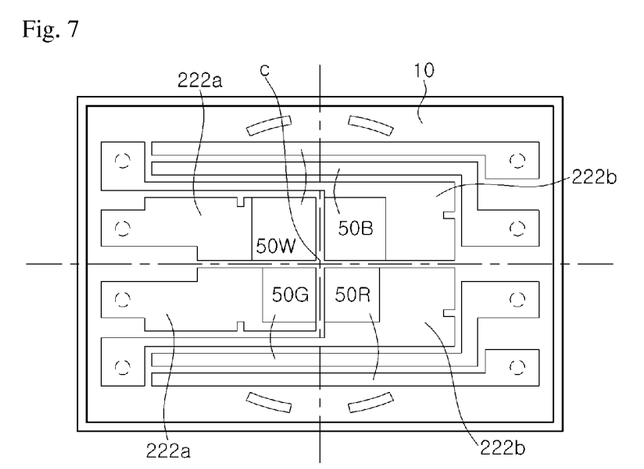

FIG. 5 to FIG. 7 are plan views of various embodiments of light emitting diode chips applicable to the light emitting diode package shown in FIG. 1 to FIG. 4.

In FIG. 5 to FIG. 7, light emitting diode chips will be denoted by new reference numerals '50W', '50B', '50G', and '50R' according to colors emitted therefrom. A light emitting diode chip emitting white light (hereinafter, 'white chip') will be denoted by 50W, a light emitting diode chip emitting blue light (hereinafter, 'blue chip') will be denoted by '50B', a light emitting diode chip emitting green light (hereinafter, 'green chip') will be denoted by '50G', and a light emitting diode chip emitting red light (hereinafter, 'red chip') will be denoted by '50R'.

As shown in FIG. 5 to FIG. 7, four light emitting diode chips 50W, 50R, 50G, 50B, which emit different colors, are mounted on four chip mounting sections 222a, 222a, 222b, 222b arranged at an angle interval of 90 degrees around the center (c), respectively. These light emitting diode chips 50W, 50R 50G, 50B mounted on the chip mounting sections 222a, 222a, 222b, 222b are located near the center (c). Among these light emitting diode chips 50W, 50R, 50G, 50B, the white chip 50W is frequently used. Thus, when a different kind of light emitting diode chip is disposed to face the white chip 50W in a diagonal direction relative to the center (c), it is possible to provide various advantages. Here, the white chip 50W includes a phosphor formed by, for example, conformal coating. For example, a white chip W formed by conformal coating a yellow phosphor on a blue light emitting diode chip may be used in this invention.

Referring to FIG. 5, the blue chip 50B is disposed symmetrical to the white chip relative to the center (c) and is located near the white chip in the diagonal direction. Blue light emitted from the blue chip 50B has a relatively low visible sensibility. When the white chip 50W is operated together with the blue chip 50B which is located near the white chip 50W to face each other in the diagonal direction, the visible sensibility can be improved by an increase of luminous flux of blue wavelengths, thereby achieving balance of mixed colors. The green chip 50G and the red chip 50R are adjacent to each other in the diagonal direction while being located near the white chip 50W and the blue chip 50B in the transverse direction and the longitudinal direction, respectively. Advantageously, the white chip 50W and the blue chip 50B have the same size, and the green chip 50G and the red chip 50R have a relatively small size. Despite size difference between the four chips 50W, 50B, 50G, 50R, the distances from the center (c) to the four chips 50W, 50B, 50G, 50R are advantageously the same.

Referring to FIG. 6, the green chip 50G is disposed symmetrical to the white chip 50W relative to the center (c) to be located near the white chip in the diagonal direction. Green light emitted from the green chip 50G has a relatively low visible sensibility. When the white chip 50W is operated together with the green chip 50G which is located near the white chip 50W to face each other in the diagonal direction, the visible sensibility can be improved by increase of luminous flux of green wavelengths, thereby achieving balance of mixed colors. The blue chip 50B and the red chip 50R are adjacent to each other in the diagonal direction while being located near the white chip 50W and the green chip 50G in the transverse direction and the longitudinal direction, respectively. The four chips 50W, 50B, 50G, 50R may have different sizes. However, despite such a size difference between the four chips 50W, 50B, 50G, 50R, the distances from the center (c) to the four chips 50W, 50B, 50G, 50R are advantageously the same.

Referring to FIG. 7, the red chip 50R is disposed symmetrical to the white chip 50W relative to the center (c) to be located near the white chip in the diagonal direction. When white light emitted from the white chip 50W is mixed with red light emitted from the red chip 50R, it is possible to obtain warm white light providing a pleasant atmosphere. The embodiment of the light emitting diode package as shown in FIG. 7 may be advantageously applied to a lighting fixture, which is designed to emit warm white light frequently. The blue chip 50B and the red chip 50R are adjacent to each other in the diagonal direction while being located near the white chip 50W and the green chip 50G in the transverse direction and the longitudinal direction, respectively. The four chips 50W, 50B, 50G, 50R may have different sizes. However, despite such a size difference between the four chips 50W, 50B, 50G, 50R, the distances from the center (c) to the four chips 50W, 50B, 50G, 50R are advantageously the same.

Figure 8:
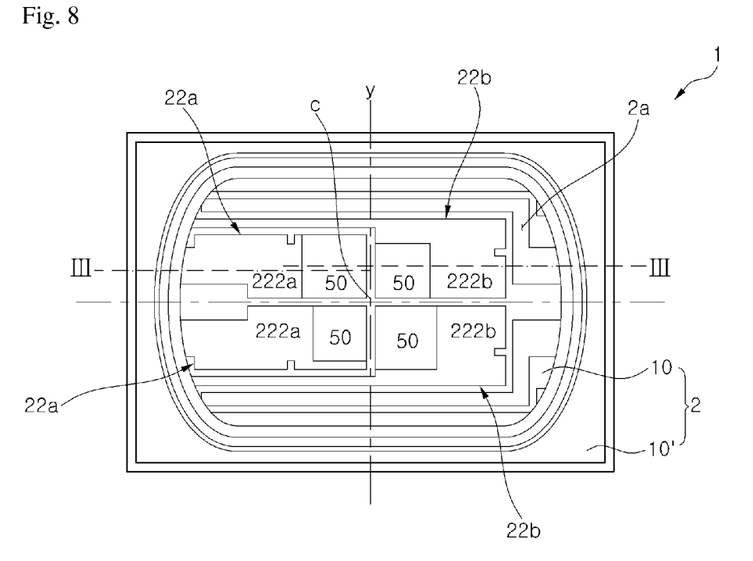
FIG. 8 is a plan view of a light emitting diode package according to another exemplary embodiment of the present invention.
Figure 9:
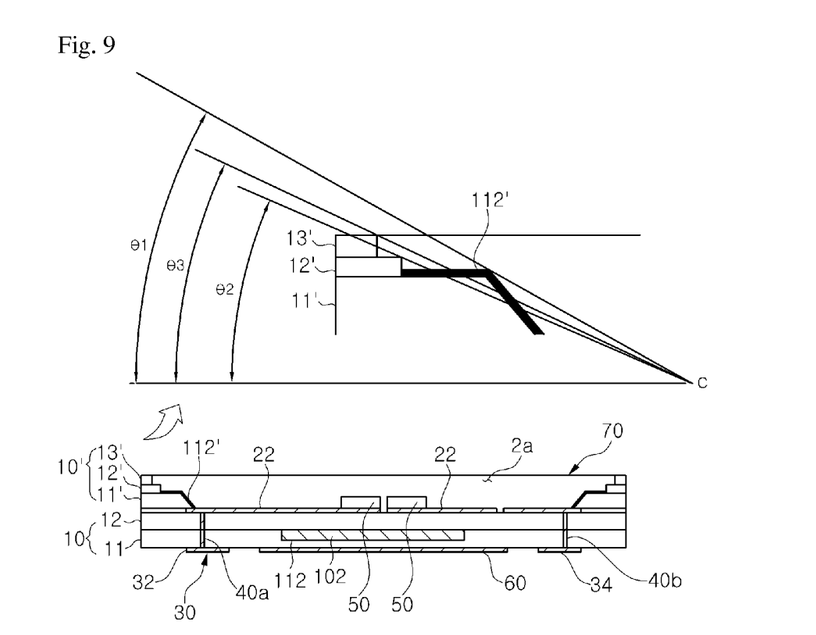
FIG. 9 is a cross-sectional view of the light emitting diode package taken along line III-III of FIG. 8.

FIG. 8 is a plan view of a light emitting diode package according to another exemplary embodiment of the present invention and FIG. 9 is a cross-sectional view of the light emitting diode package taken along line III-III of FIG. 8.

Referring to FIG. 8 and FIG. 9, a light emitting diode package 1 according to this embodiment includes a package body 2, which includes a cavity 2a for receiving a plurality of light emitting diode chips 50, 50, 50, 50.

As best shown in FIG. 9, the package body 2 may be formed by coupling a reflector 10' to a substrate 10, which has the same or similar structure to that of the above embodiment.

The substrate 10 may be formed by stacking a plurality of insulating via plates including via holes, particularly ceramic via plates 11, 12. In addition, the substrate 10 is provided with a heat sink 102 made of a metallic material.

The heat sink 102 may be formed between a first via plate 11 and a second via plate 12 constituting the substrate 10. More specifically, the first via plate 11 is formed with a filling recess 112, which has a predetermined depth and is filled with metal to form the heat sink 102. Since the second via plate 12 is stacked on the first via plate 11, the heat sink 102 may be formed inside the substrate 10 without being exposed to the outside.

Advantageously, the heat sink 102 has a wide plate shape and a larger area than the total area occupied by the light emitting diode chips 50 directly under the regions on which the light emitting diode chips 50 are mounted.

The substrate 10 includes via holes successively passing through the first via plate 11 and the second via plate 12, such that vias 40a, 40b are defined through the via holes. Each of the first and second via plates 11, 12 may be a monolithic plate, or a multilayered plate which are prepared by stacking two or more plates.

The other features of the substrate 10 and features of upper and lower terminal patterns 20, 30 and vias 40a, 40b formed on the substrate 10 are substantially the same as those of the embodiment described with reference to FIG. 1 to FIG. 4. Thus, detailed descriptions thereof will be omitted.

The reflector 10' may be formed by stacking a plurality of insulating cavity plates including cavity holes, particularly, ceramic cavity plates 11', 12', 13'.

More specifically, the reflector 10' includes a first cavity plate 11' stacked on an upper surface of the substrate 10 and formed with a first cavity hole having the smallest diameter, a second cavity plate 12' stacked on the first cavity plate 11' and formed with a second cavity hole having a larger diameter than the first cavity hole, and a third cavity plate 13' stacked on the second cavity plate 13' and formed with a third cavity hole having a larger diameter than the second cavity hole. The cavity plates 11', 12', 13' are stacked to have the first, second and third cavity holes arranged coaxially.

In the first cavity plate 11', the first cavity hole is formed to have a diameter gradually increasing upwards so as to form an inclined inner peripheral surface. In addition, the inclined inner peripheral surface of the first cavity hole is coated with a highly reflective metal such as Ag to form a metal reflective layer 112'. A stepped face is formed between the first cavity plate 11' and the second cavity plate 12' due to a difference in diameter between the cavity holes thereof, and the metal reflective layer 112' extends to the stepped face. A portion of the reflective layer 112' extending to the stepped face may serve to reflect light, which cannot pass through the encapsulation material due to internal total reflection, such that the reflected light can be emitted outside the encapsulation material. Among the cavity plates, the first cavity plate 11' including the reflective layer 112' or a reflective surface formed thereby is formed to have the largest thickness in order to improve reflection performance of the reflector 10'.

The cavity holes of the second cavity plate 12' and the third cavity plate 13' are not formed with a reflective layer. In addition, a stepped face is formed at an upper side of the cavity due to a difference in diameter between the cavity holes of the second and third cavity plates 12', 13', and may assist in formation of a light transmitting encapsulation material 70' in a desired shape by facilitating control of the amount of a light transmitting resin upon filling the cavity 2a with the light transmitting resin in a liquid or gel phase to form the light transmitting encapsulation material 70'. Further, the stepped face provides a long and complicated moisture infiltration path between the light transmitting encapsulation material 70' and a cavity wall, thereby enabling reduction of moisture infiltration. Meanwhile, since the reflective layer 112' is restrictively formed at a lower portion of the cavity 2a, and the cavity 2a is filled with the light transmitting resin such that the reflective layer 112' is completely covered by the light transmitting resin, it is possible to prevent oxidation of the reflective layer 112' due to exposure of the reflective layer 112'. Advantageously, an angle θ1 defined between a horizontal line and an imaginary line extending from a middle point between the light emitting diode chips 50 to an upper end of the reflective layer 112' is greater than an angle θ2 defined between the horizontal line and an imaginary line extending from the center (c) to an inner edge of a stepped portion at an upper side of the reflective layer 112' and an angle θ2 defined between the horizontal line and an imaginary line extending from the center (c) to the upper end of the reflector 10'. With this configuration, it is possible to achieve significant reduction of optical loss due to contact between light and a portion free from the light reflective layer 112'.

Figure 10:
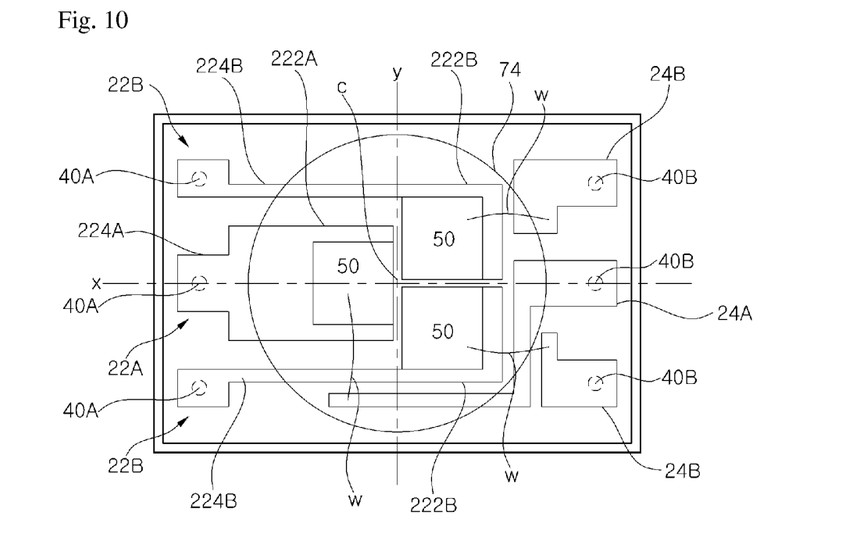
FIG. 10 is a plan view of a light emitting diode package according to a further exemplary embodiment of the present invention.
Figure 11:
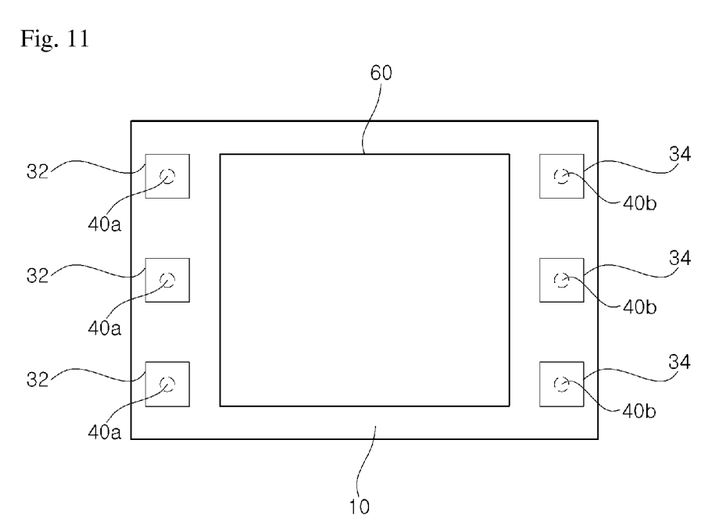
FIG. 11 is a bottom view of the light emitting diode package shown in FIG. 10.

FIG. 10 is a plan view of a light emitting diode package according to a further exemplary embodiment of the present invention and FIG. 11 is a bottom view of the light emitting diode package shown in FIG. 10.

Referring to FIG. 10, the terminal pattern includes three primary upper terminals 22A, 22B, 22B and three secondary upper terminals 24A, 24B, 24B corresponding thereto. Each of the three primary upper terminals 22A, 22B, 22B includes a chip mounting section 222A or 222B, and an extension 224A or 224B extending from the chip mounting section in a first direction and connected to an upper end of a via 40A near one side of the substrate 10. Further, each of the three secondary upper terminals 24A, 24B, 24B is connected to an upper end of a via 40B near the other side of the substrate 10 opposite the one side of the substrate. The three secondary upper terminals 24A, 24B, 24B are connected to bonding wires (w) extending from the light emitting diode chips 50 instead of mounting the light emitting diode chips 50 thereon.

Three chip mounting sections 222A, 222B, 222B of the three primary upper terminals 22A, 22B, 22B are arranged around the center of the substrate 10. A point at which an imaginary horizontal line (x) intersects an imaginary vertical line (y) on the substrate 10 will be defined as the center (c). At this time, it is desirable that a central axis of the lens section 74, that is, an optical axis of the light emitting diode package, pass through the center (c).

The three light emitting diode chips 50 are mounted on the three chip mounting sections 222A, 222A, 222B, respectively, and located near the center (c). Further, the three light emitting diode chips 50 are arranged around the center (c). The three light emitting diode chips 50 are different types of chips, which emit light having different wavelengths or colors, and may have different sizes. Regardless of the size difference, the light emitting diode chips 50 are preferably separated substantially the same distance from the center (c). Advantageously, the three light emitting diode chips 50 are selected from among a white chip, a blue chip, a green chip and a red chip. Here, the white chip includes a phosphor layer formed by conformal coating.

When the three light emitting diode chips 50, arranged around the center (c) to be adjacent to each other, emit light at the same time, the light emitting diode chips 50 may act as a single integrated light source. Further, the central axis or optical axis of the lens section 74 is disposed to pass through the center of the integrated light source, whereby light finally emitted through the light transmitting encapsulation material 70 can be uniformly distributed.

The three extensions 224A, 224B, 224B of the primary upper terminals 22A, 22B, 22B extend from the three chip mounting sections 222A, 222B, 222B of the primary upper terminals 22A, 22B, 22B in the first direction and are connected to upper ends of three first vias 40A arranged in series near one side of the substrate 10.

For a first primary upper terminal 22A which has the chip mounting section located at a left side nearer to one side of the substrate 10 relative to the center of the substrate 10, since there is no other terminal in the direction in which the extension 224A extends, it is not necessary to take the width of the extension 224A into account.

However, for two second primary upper terminals 22B, 22B which are placed around the first primary upper terminal 22A and have the chip mounting sections located at a right side farther from the one side of the substrate 10, since there is provided a chip mounting section 222A of the first primary upper terminal 22A in the first direction in which the two extensions 224B, 224B extend, the chip mounting sections 222B, 222B are formed to have a slightly greater width than the chip mounting section 222A of the first primary upper terminal 22A, and the extensions 224B, 224B are formed to extend in the first direction and have a width substantially corresponding to the increased width of the chip mounting sections 222B, 222B. With this structure, the width of the extension 224A of the first primary upper terminal 22A may be greater than the width of the extensions 224B, 224B of the second primary upper terminals 22B, 22B.

The three chip mounting sections 222A, 222B, 222B and the three light emitting diode chips 50, 50, 50 mounted thereon are arranged at an angle interval of 120 degrees around the center (c).

The three extensions 224A, 224B, 224B of the first and second primary upper terminals 22A, 22B, 22B extend from the three chip mounting sections 222A, 222B, 222B of the first and second primary upper terminals 22A, 22B, 22B in the first direction and are connected to the upper ends of the three first vias 40A arranged in series near the one side of the substrate 10.

The first secondary upper terminal 24A corresponding to the first primary upper terminal 22A, in which the chip mounting section 222A is biased towards the left side at which the first via 40A is placed, may be linearly elongated from a portion connected to the upper end of the second via 40B to be located near the chip mounting section 222A of the first primary upper terminal 22A. On the other hand, the second secondary upper terminals 24B, 24B corresponding to the second primary upper terminals 22B, 22B, in which the chip mounting sections 222B are biased towards the right side at which the second vias 40b are placed, may be formed in approximately island shapes at locations of the second vias.

Since the three light emitting diode chips 50, 50, 50 mounted on the chip mounting sections 222A, 222B, 222B of the primary upper terminals 22A, 22B, 22B separated from each other are individually connected to the three secondary upper terminals 24A, 24B, 24B separated from each other via bonding wires (w), respectively, it is possible to achieve individual operation of the three light emitting diode chips 50, 50, 50.

As described above, the primary upper terminals 22A, 22B, 22B are connected at distal ends thereof to the three first vias 40a near the one side of the substrate 10, and the secondary upper terminals 24A, 24B, 24B are connected at distal ends thereof to the three second vias 40b near the other side of the substrate 10.

Referring to FIG. 11, the three first vias 40a perpendicularly penetrate the substrate 10 and are connected to the three primary lower terminals 32 formed on the lower surface of the substrate 10, and the three second vias 40b perpendicularly penetrate the substrate 10 and are connected to the three secondary lower terminals 34 formed on the lower surface of the substrate 10. The primary upper terminal 22A or 22B, first via 40a and primary lower terminal 32 successively connected to one another constitute a single first lead, which is directly connected to the light emitting diode chips 50, and the secondary upper terminal 24A or 24B, second via 40b and secondary lower terminal 34 successively connected to one another constitute a second lead.

The three light emitting diode chips 50, 50, 50, 50 are directly mounted on three first leads and electrically connected to lower electrodes of the corresponding light emitting diode chips, and the three bonding wires extending from upper electrodes of the three light emitting diode chips 50, 50, 50 are bonded to three second leads, respectively. Accordingly, when the light emitting diode package 1 is mounted on a printed circuit board (not shown), each of the three primary lower terminals 32 for the three first leads and each of the three secondary lower terminals 34 for the three second leads are individually connected to electrode pads on the printed circuit board, whereby the three light emitting diode chips 50, 50, 50 of the light emitting diode package 1 can be individually operated.

The three first leads and the three primary lower terminals 32 thereof have the same polarity, and the three second leads and the three secondary lower terminals 34 thereof have the same electric polarity opposite to the polarity of the first leads.

As mentioned above, the substrate 10 is formed on a lower surface thereof with a heat sink pad 60, which has substantially the same thickness as that of the lower terminals 32, 34. The heat sink pad 60 is located at the center of the substrate 10 between the three primary lower terminals 32 and the three secondary lower terminals 34. The heat sink pad 60 contacts the substrate 10 over a wide area in order to dissipate heat to the outside by absorbing heat from the substrate 10 through the contact area, and may have a larger area than the total area of the chip mounting sections 222A, 222B, 222B on the upper surface of the substrate 10. Furthermore, it is advantageous that the heat sink pad 60 have a larger area than the total area of the primary lower terminals 32 and the secondary lower terminals 34 on the lower surface of the substrate 10.

According to the present invention, at least three light emitting diode chips, for example, four light emitting diode chips, are disposed as close as possible to act as a single integrated light source while allowing individual operation of the light emitting diode chips, thereby realizing a light emitting diode package capable of emitting light having various colors (wavelengths).

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

The invention claimed is:

1. A light-emitting diode package, comprising:
   first, second, and third light-emitting diode chips;
   first leads comprising first, second, and third chip mounting sections on which the first, second, and third light-emitting diode chips are disposed, respectively;
   second leads separated from the first leads and connected to the first, second, and third light-emitting diode chips via wires, respectively; and
   a substrate comprising:
      the first leads and the second leads disposed on a first surface of the substrate;
      a first insulating plate comprising a filling recess;
      a heat sink disposed only in the filling recess of the first insulating plate; and
      a second insulating plate disposed on the first insulating plate and covering the filling recess and the heat sink,
   wherein the first, second, and third chip mounting sections are disposed around a center of the substrate through which an optical axis of the light-emitting diode package passes.

2. The light-emitting diode package according to claim 1, wherein:
   the first leads extend in a first direction to form first, second, and third primary lower terminals at a first side of the substrate; and the second leads extend in a second direction opposite to the first direction to form first, second, and third secondary lower terminals a second side of the substrate.

3. The light-emitting diode package according to claim 2, wherein the first, second, and third chip mounting sections are disposed at constant angles around the center of the substrate.

4. The light-emitting diode package according to claim 2, further comprising a heat sink pad disposed on a second surface of the substrate,
wherein the heat sink pad is disposed between the first, second, and third primary lower terminals and the first, second, and third secondary lower terminals.

5. The light-emitting diode package according to claim 4, wherein the heat sink pad has a larger area than a total area of the first, second, and third chip mounting sections.

6. The light-emitting diode package according to claim 1, wherein the first leads comprise:
first, second, and third primary upper terminals disposed on an upper surface of the substrate, so that the first, second, and third chip mounting sections and first, second, and third extensions extend from the first, second, and third chip mounting sections; and
first, second, and third vias penetrating the substrate and connecting the first, second, and third extensions to first, second, and third primary lower terminals disposed on a lower surface of the substrate, respectively; and
wherein the second leads comprise:
first, second, and third secondary upper terminals disposed outside the first, second, and third chip mounting sections and electrically connected to the first, second, and third light emitting diode chips via bonding wires, respectively; and
fourth, fifth, and sixth vias penetrating the substrate and connecting the first, second, and third secondary upper terminals to the first, second, and third secondary lower terminals, respectively.

7. The light-emitting diode package according to claim 1, wherein the first, second, and third light-emitting diode chips are separated at a constant distance from the center of the substrate.

8. The light-emitting diode package according to claim 1, further comprising:
a reflector disposed on the substrate;
a cavity surrounded by the reflector, in which the first, second, and third light-emitting diode chips are disposed; and
a light-transmitting encapsulation material comprising a light-transmitting resin disposed in the cavity.

9. The light-emitting diode package according to claim 8, further comprising a reflective layer disposed on the reflector to a partial height of the cavity,
wherein the light-transmitting encapsulation material covers an upper end of the reflective layer.

10. The light-emitting diode package according to claim 9, wherein the reflector comprises:
a first cavity plate disposed on an upper surface of the substrate and comprising a first cavity hole; and
a second cavity plate disposed on the first cavity plate and comprising a second cavity hole having a larger diameter than the first cavity hole,
wherein the reflective layer is coated on an inclined inner peripheral surface of the first cavity hole and extends to a first stepped face adjacent to the second cavity plate.

11. The light-emitting diode package according to claim 10, wherein:
the reflector further comprises a third cavity plate disposed on the second cavity plate and comprising a third cavity hole having a larger diameter than the second cavity hole; and
the cavity comprises a second stepped face adjacent to the third cavity plate.

12. The light-emitting diode package according to claim 1, wherein the heat sink is disposed inside the substrate.

13. The light-emitting diode package according to claim 1, wherein the first, second, and third light-emitting diode chips comprise at least three selected from a white chip, a blue chip, a green chip, and a red chip.

14. The light-emitting diode package according to claim 1, further comprising a fourth chip mounting sections disposed around the center of the substrate and a fourth light-emitting diode chip,
wherein the first, second, third, and fourth light-emitting diode chips comprise a white chip, a blue chip, a green chip, and a red chip disposed on the first, second, third, and fourth chip mounting sections, respectively.

15. The light-emitting diode package according to claim 1, wherein:
the first and second chip mounting sections are disposed adjacent to each other in a diagonal direction relative to the center of the substrate; and
a white chip and a blue chip are respectively disposed on the first and second chip mounting sections.

16. The light emitting diode package according to claim 1, wherein:
the first and second chip mounting sections are disposed adjacent to each other in a diagonal direction relative to the center of the substrate; and
a white chip and a green chip are respectively disposed on the first and second chip mounting sections.

17. The light emitting diode package according to claim 1, wherein:
first and second chip mounting sections are disposed adjacent to each other in a diagonal direction relative to the center of the substrate; and
a white chip and a red chip are respectively disposed on the first and second chip mounting sections.

18. The light-emitting diode package according to claim 1, wherein the first leads have the same polarity, and the second leads have a different polarity than the first leads.

19. The light-emitting diode package according to claim 1, wherein the second insulating plate is disposed on the first insulating plate to directly cover the filling recess and the heat sink.

20. A light-emitting diode package, comprising:
first, second, third, and fourth light-emitting diode chips comprising a white chip, a blue chip, a green chip, and a red chip, respectively;
first leads and second leads configured to allow individual operation of the first, second, third, and fourth light-emitting diode chips;
a substrate comprising:
the first leads and the second leads disposed on a first surface of the substrate;
a first insulating plate comprising a filling recess;
a heat sink disposed only in the filling recess of the first insulating plate;
a second insulating plate disposed on the first insulating plate and covering the filling recess and the heat sink; and
a light transmitting encapsulation part disposed on the substrate and comprising a lens section covering the first, second, third, and fourth light-emitting diode chips, wherein one of the blue chip, the green chip, and the red chip is disposed near the white chip in a diagonal direction.

* * * * *